United States Patent [19]

Uematsu et al.

[11] Patent Number: 5,024,953
[45] Date of Patent: Jun. 18, 1991

[54] METHOD FOR PRODUCING OPTO-ELECTRIC TRANSDUCING ELEMENT

[75] Inventors: Tsuyoshi Uematsu, Koganei; Tadashi Saitoh, Tokyo, both of Japan

[73] Assignee: Hitachi, Ltd., Tokyo, Japan

[21] Appl. No.: 325,577

[22] Filed: Mar. 20, 1989

[30] Foreign Application Priority Data

Mar. 22, 1988 [JP] Japan ................................ 63-65709
Sep. 12, 1988 [JP] Japan ................................ 63-226613

[51] Int. Cl.$^5$ .............................................. H01L 31/18
[52] U.S. Cl. ........................................ 437/2; 136/255;
136/256; 136/259; 156/647; 156/662
[58] Field of Search ............... 136/244, 255, 256, 259;
437/2-5; 156/647, 662

[56] References Cited

U.S. PATENT DOCUMENTS

| | | | |
|---|---|---|---|
| 3,150,999 | 9/1964 | Rudenberg et al. | 136/256 |
| 3,152,925 | 10/1964 | Power | 136/246 |
| 4,328,390 | 5/1982 | Meakin et al. | 136/259 |
| 4,352,948 | 10/1982 | Kaplow et al. | 136/249 |
| 4,379,944 | 4/1983 | Borden et al. | 136/259 |
| 4,453,030 | 6/1984 | David et al. | 136/256 |
| 4,501,636 | 2/1985 | Valley | 156/345 |
| 4,514,583 | 4/1985 | Izu et al. | 136/259 |
| 4,608,451 | 8/1986 | Landis | 136/256 |
| 4,626,613 | 12/1986 | Wenham et al. | 136/255 |
| 4,644,091 | 2/1987 | Hayashi et al. | 136/259 |
| 4,665,277 | 5/1987 | Sah et al. | 136/255 |
| 4,759,735 | 7/1988 | Pagnol et al. | 441/16 |

FOREIGN PATENT DOCUMENTS

| | | | |
|---|---|---|---|
| 2715471 | 10/1978 | Fed. Rep. of Germany | 136/256 |
| 2489597 | 3/1982 | France | 136/256 |
| 2551267 | 3/1985 | France | 136/256 |

OTHER PUBLICATIONS

CRC Handbook of Chemistry & Physics, 51st Edition (1970-1971), p. B-80.
15th IEEE Photovoltaic Specialists Conference, May 12, 1981, Kissimee, Florida, U.S.A., pp. 867-870; A. Goetzberger: "Optical Confinement in Thin Si-Solar Cells by Diffuse Back Reflectors".

*Primary Examiner*—Aaron Weisstuch
*Attorney, Agent, or Firm*—Kenyon & Kenyon

[57] ABSTRACT

An opto-electric transducing element and a method for producing the same use a corrugated semiconductor substrate to produce an opto-electric transducing element. The element has a reduced effective thickness and an improved opto-electric conversion efficiency, while maintaining the mechanical strength.

9 Claims, 12 Drawing Sheets

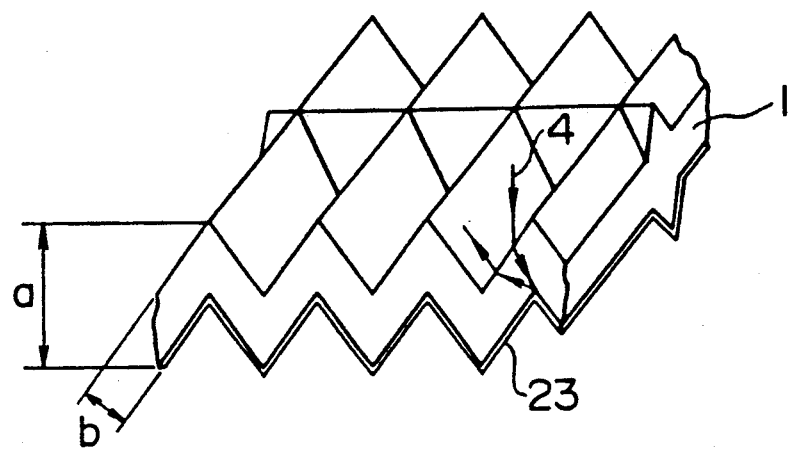
FIG. 12
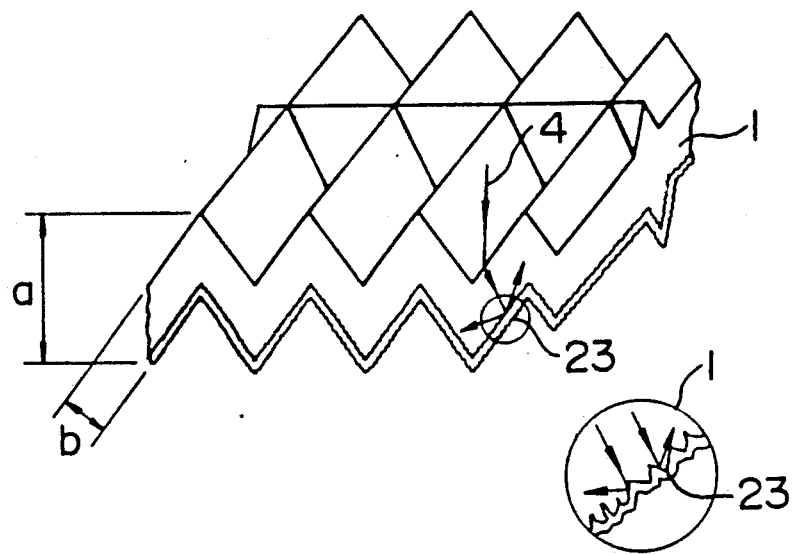
FIG.13(a)
FIG.13(b)
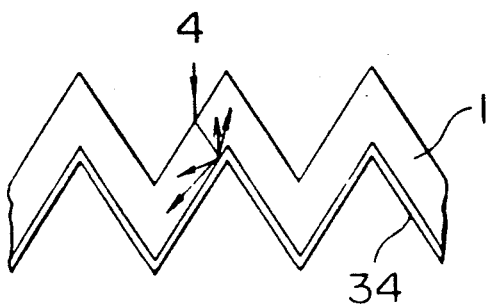
FIG. 14

FIG. 30
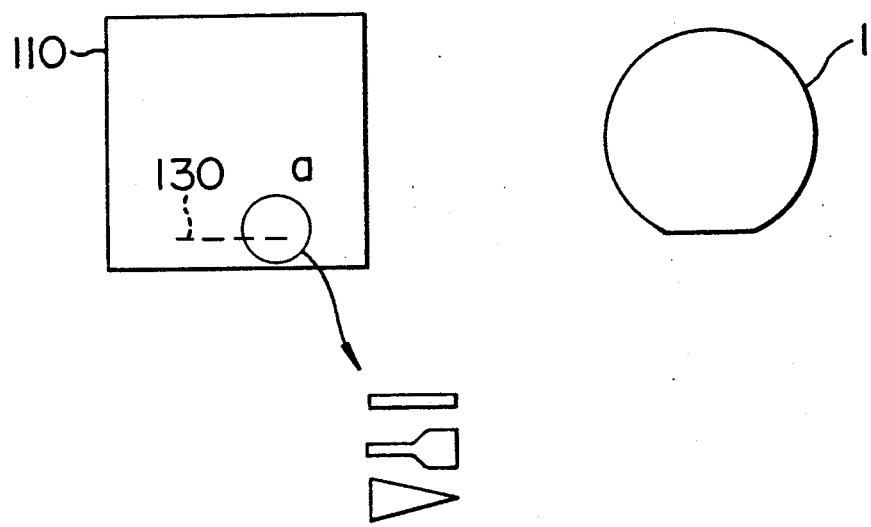
FIG. 31(a)    FIG. 31(b)
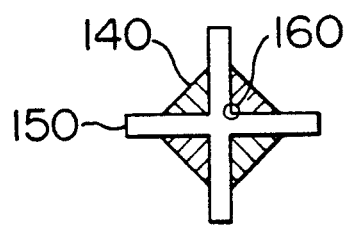 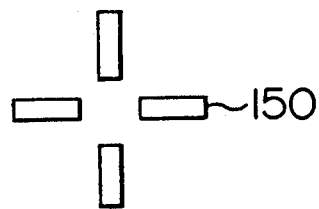
FIG. 32(a)    FIG. 32(b)
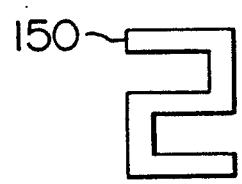 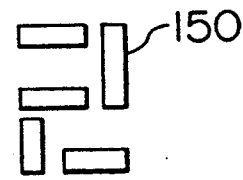
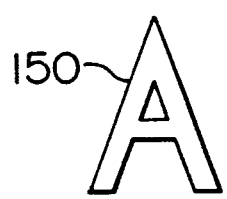 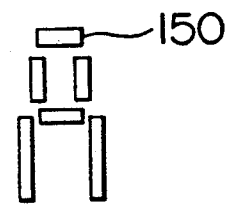

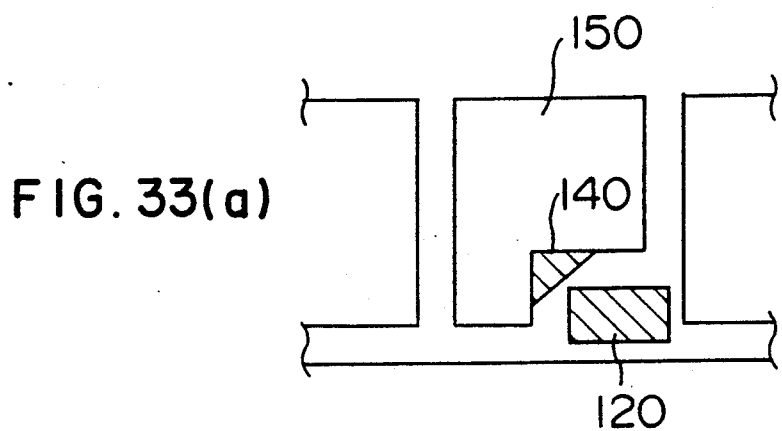
FIG. 33(a)
FIG. 33(b)
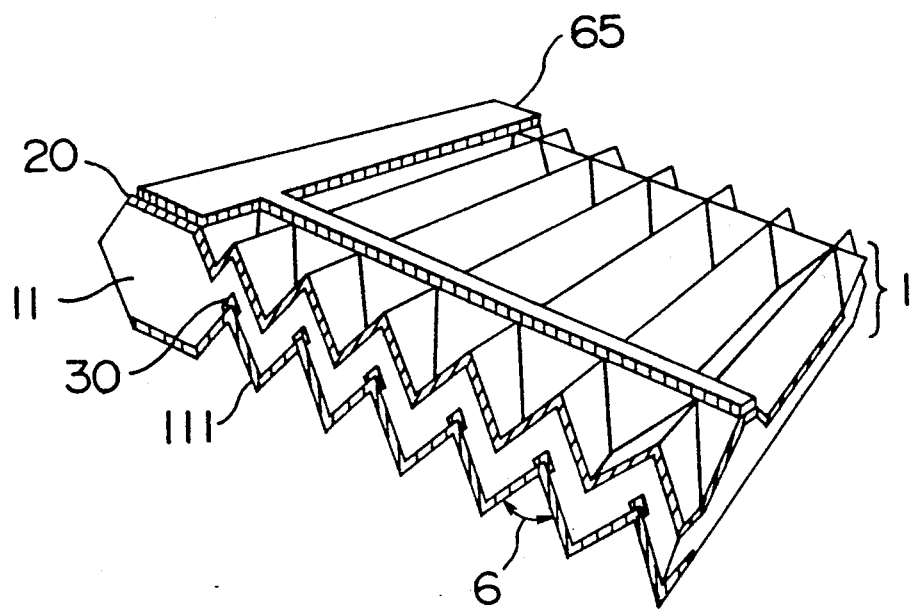
FIG. 34

METHOD FOR PRODUCING OPTO-ELECTRIC TRANSDUCING ELEMENT

BACKGROUND OF THE INVENTION

The present invention relates to an opto-electric transducing element and an opto-electric transducing module, and particularly, to a thinned opto-electric transducing element and an opto-electric transducing module which is correspondingly reduced in weight and improved in opto-electric conversion efficiency.

The conventional opto-electric transducing element is shaped to have a substantially planar section, except for a structure such as an electrode formed on the face or back of the said opto-electric transducing element and a roughness or texture on the face or back, such as a V-shaped groove structure having a roughness or texture relatively small as compared with the thickness of the element, as shown in Solar Cells, 17 (1986), pages 75 to 83.

It is well known to provide an improvement in conversion efficiency and a reduction in weight of the element by reducing the thickness of the opto-electric transducing element.

SUMMARY OF THE INVENTION

In the above prior art, provision is not made for the mechanical strength of the element when the thickness of the opto-electric transducing element is reduced, and it is difficult to produce an element having a larger area.

It is an object of the present invention to provide a structure which does not impair the mechanical strength even if the thickness of the opto-electric transducing element is reduced.

It is another object of the present invention to provide a structure of an opto-electric transducing element and an opto-electric transducing module, which is capable of sufficiently absorbing incident light, even if the thickness of the said opto-electric transducing element is reduced.

It is a further object of the present invention to provide an opto-electric transducing element having a high opto-electric conversion efficiency.

It is a yet further object of the present invention to provide a process for producing, with a high accuracy and a good reproducibility, an opto-electric transducing element having a high mechanical strength and a high opto-electric conversion efficiency.

The above objects are accomplished by providing an opto-electric transducing element which is formed, in both or one of its face and back, with grooves having a depth substantially equal to or about one third of the thickness of the opto-electric transducing element, thereby forming a sectional profile of the opto-electric transducing element into a corrugated structure to reduce the thickness, while maintaining, a large distance between a plane connecting ridges on the face of the corrugated structure and a plane connecting ridges on the back, thus enhancing the mechanical strength against a stress externally acting on the element.

Further, the above objects are accomplished by providing an opto-electric transducing element having a corrugated section, which employs, on its side opposite from its light incidence surface, i.e., on its back, a light diffuse-reflecting arrangement for diffusedly reflecting light in an angular direction in respect to the opto-electric transducing element.

Yet further, the above objects are accomplished by disposing a semiconductor containing a large amount of impurities or a semiconductor having a wider band gap on a portion having a corrugated section and containing a small amount of photo-excited carriers, or by disposing thereon a portion with which a member having the property of increasing the surface recombination contacts, such as an electrode.

Still yet further, the above objects are accomplished by bringing the orientation of a single crystal substrate into correct alignment with the direction of an etching mask.

BRIEF DESCRIPTION OF THE DRAWINGS

FIG. 12 is a perspective view of a substrate having V-grooves according to the present invention.

FIG. 13 is a perspective view of an application of the present invention.

FIG. 14 is a sectional view of another application of the present invention.

FIG. 30 is a plan view illustrating an example of an alignment of the orientation of a single crystal substrate with the direction of a mask.

FIGS. 31(a) and (b) are plan views illustrating a configuration of an alignment mask, respectively.

FIGS. 32(a) and (b) are diagrams illustrating examples of patterns of a character and a numeral, respectively.

FIGS. 33(a) and (b) are diagrams illustrating examples of etching patterns, respectively.

FIG. 34 is a perspective view of an embodiment according to the present invention.

DETAILED DESCRIPTION OF THE PRESENT INVENTION

Figure 1:
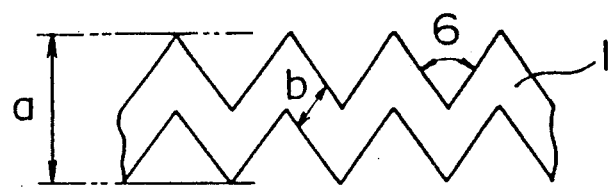
FIG. 1 is a sectional view of a substrate having a grooved structure according to the present invention.
Figure 2:
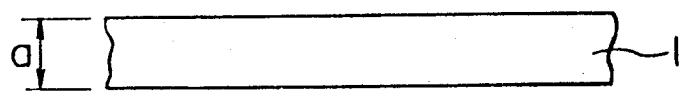
FIG. 2 is a sectional view of a prior art substrate.

The present invention will now be described by way of preferred embodiments with reference to the accompanying drawings. Referring to FIG. 1, there is shown a section of a semiconductor substrate 1 for use in forming an opto-electric transducing element. Ridges of a grooved structure formed on the face of the substrate 1 are adapted to mate with recesses of a grooved structure formed on the back of the substrate 1. This makes it possible to reduce the effective thickness b of the substrate 1 as compared with the substrate thickness a, thereby permitting the effective substrate thickness b to be reduced as compared with a substrate having the same effective thickness as the substrate thickness a in a structure as shown in FIG. 2. It is desirable that the depth of the groove is one third or more of the said substrate thickness a of the substrate 1. This is because any larger depth of the said groove will cause a sudden decrease in effective thickness b. Accordingly, the effective thickness b of the substrate can be about one half of the substrate thickness a when the bevel angle of the said groove is of 90°. The said grooves having a depth increased to a level as large as the said substrate thickness a make it possible to significantly reduce the effective thickness b of the said substrate. Further, the structure shown in FIG. 1 is high in mechanical strength because of its cross-section of a triangular corrugated structure and also has a light trapping effect which reduces the surface reflection of incident light, when light is projected into an opto-electric transducing element fabricated using such substrate from its front or back. In this case, the angle 6 formed by opposed bevels in the said grooved structure is required to be of 90° or less.

Figure 3:
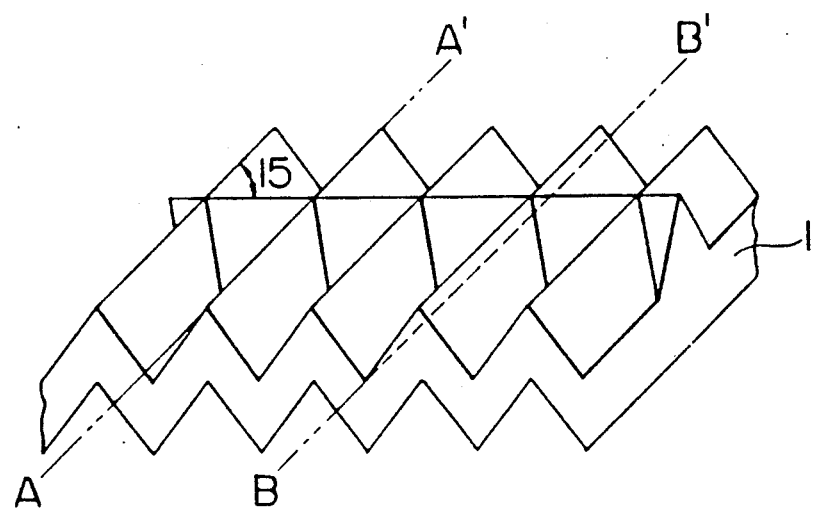
FIG. 3 is a perspective view of a substrate according to the present invention.
Figure 4A:
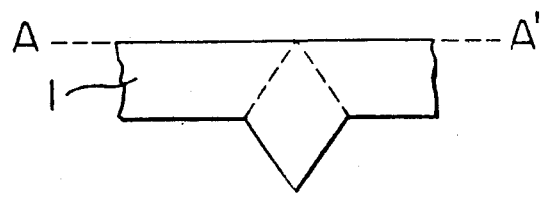
FIG. 4(a) is a sectional view taken along a line A—A' in FIG. 3.
Figure 4B:
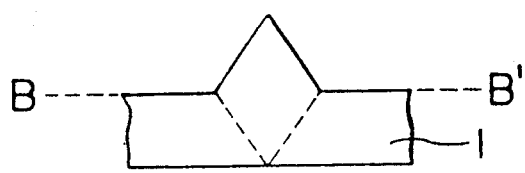
FIG. 4(b) is a sectional view taken along a line B—B' in FIG. 3.
Figure 5:
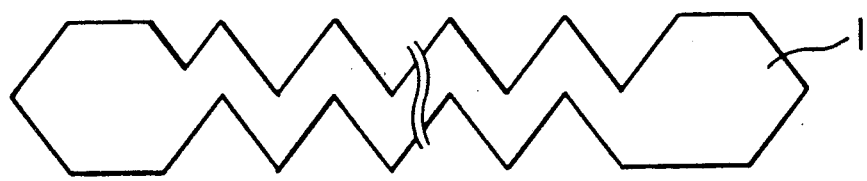
FIG. 5 is a sectional view of a substrate which is not grooved at its ends.

In order to further enhance the mechanical strength of the said opto-electric transducing element, it is effective to provide a substrate of a grooved structure having a non-grooved portion remaining on a straight or curved line in a direction transversing the said grooved structure as shown in FIG. 3. Such portion may be of a configuration with no groove formed therein as shown in FIGS. 4(a) and (b). The mechanical strength may be improved by setting smaller one 15 of the angles formed by such non-grooved portion in respect to the grooved structure in a range of 45° or more to 90° or less. Particularly, when such angle is of 90°, i.e., when such non-grooved portion intersects the grooved structure at a right angle, the mechanical strength can be increased to the utmost. Alternatively, the mechanical strength can be further increased by leaving a non-grooved portion around the periphery of said substrate as shown in FIG. 5.

Figure 6:
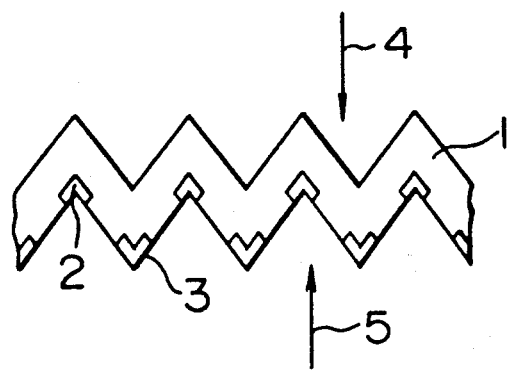
FIG. 6 is a sectional view of a potential application or use of the present invention.

In fabrication of an opto-electric transducing element by use of a substrate having such a structure, particularly, when using a semiconductor of a type different from the other portion for formation of a pn junction on a part of its face or back, as shown in FIG. 6, carriers within a substrate 1 can be effectively collected by forming such a semiconductor 2 or 3 only at the ridge or recess of the said groove. When light is to be projected into the said opto-electric transducing element from its face or back, the carrier collection efficiency can be enhanced and the output current can be increased both by projecting the incident light 5 into the semiconductor 2 or 3 from the same surface. If the lifetime of the carrier in the substrate, 1 is sufficiently large, however, light may be projected from the direction indicated by 4 in FIG. 6.

Figure 7:
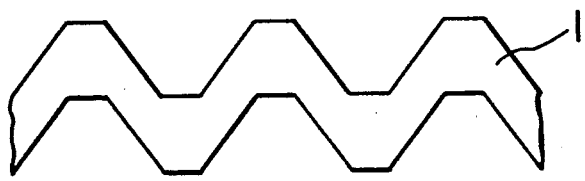
FIG. 7 is a sectional view of another potential application of the present invention.
Figure 8:
FIG. 8 is a sectional view of yet another potential application of the present invention.

The same is true with a structure having a flat portion at the ridge of the said grooved structure, as shown in FIG. 7, and also with a structure having substantially parallel opposed faces of the said grooved structure, as shown in FIG. 8.

Figure 9:
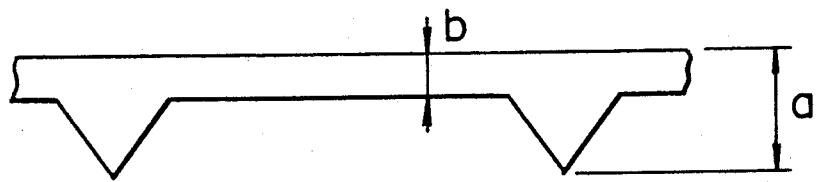
FIG. 9 is a sectional view of a substrate having a grooved surface only on a single surface thereof.
Figure 10:
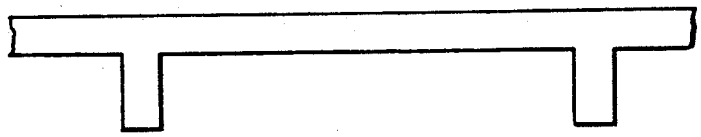
FIG. 10 is a sectional view of another substrate having a grooved surface only on a single surface thereof.

The same is also true with said grooved structure formed on only one of the face and the back, as shown in FIGS. 9 and 10.

In said opto-electric transducing element having any of these structures, it is a matter of course that the opto-electric conversion efficiency is further enhanced by provision of a texture structure or a grooved structure on the face or back, or by provision of a light-reflective arrangement on a surface opposite from a light incidence surface.

Figure 11:
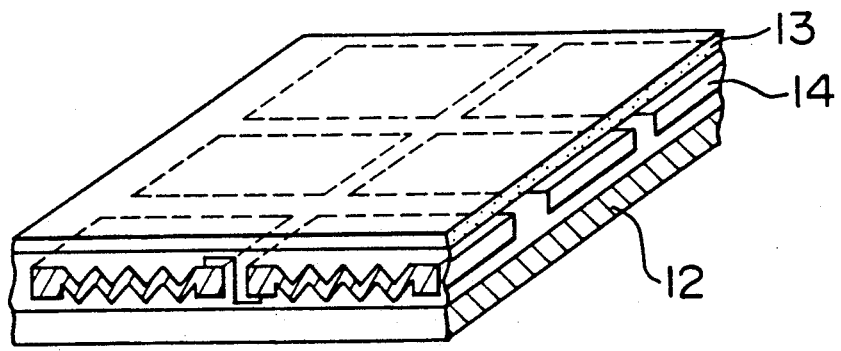
FIG. 11 is a perspective view of one embodiment of an opto-electric transducing module produced using an opto-electric transducing element according to the present invention.

The opto-electric transducing element having the above-described structure is high in opto-electric conversion efficiency and can be also reduced in weight as compared with the prior art structure. Thereupon, by fabrication of an opto-electric transducing module by combination of one or more said opto-electric transducing elements as shown in FIG. 11, an improvement in output and a reduction in weight of said opto-electric transducing module can be achieved. In said opto-electric transducing module, the opto-electric transducing element 14 is convered with a covering material 13, but this covering material need not necessarily be employed.

The above opto-electric transducing element and opto-electric transducing module are useful particularly when they require a high efficiency, and for a space use requiring a reduction in weight. In addition, the opto-electric transducing element will experience little radiation damage because of its thin type.

In the opto-electric transducing element having the above-described structure, the ridges of the grooved structure which are formed on the light incidence surface, i.e., face of the element shown in FIG. 12, are adapted to substantially mate with the recesses of the grooved structure which are formed on the back of the element. This makes it possible to reduce the effective thickness b of the element as compared with the thickness a of the substrate 1. In this case, the effective thickness b of the substrate 1 is several tens of µm or less and hence, if the light absorption coefficient of the substrate 1 is small, a part of the incident light 4 is transmitted to the back with the structure left intact. This will bring about a reduction in output current from the element. The following is conceived as one suggestion for avoiding this: A back reflector 23 is formed on the back as shown in FIG. 12, so that the optical path may be lengthened by specular reflection of the light transmitted through the substrate, thereby increasing the absorption of light. With this structure, however, the length of the optical path is only lengthened about two times as compared with the case where there is no back reflector. This is insufficient because the effective thickness b of the element is too small to improve the opto-electric conversion efficiency of the opto-electric transducing element made by use of the substrate having a sectional profile as shown in FIG. 12.

To the contrary, the present inventors have found that a fine texture provided on the back of the substrate 1, and a reflector 23 formed thereon by use of a material having a high light-reflectance such as Al or Ag, as shown in FIG. 13, provides a diffuse-reflection of transmitted light. This causes the reflected light to pass a longer distance through the substrate 1, leading to an increased optical path length. In addition, because the angle formed by the reflected light together with the substrate face is smaller, the light which has not been absorbed is further totally reflected on the substrate face and propagated again through the substrate. This ensures that most of the light 4 once projected into the substrate 1 is trapped within the substrate 1, resulting in an efficient absorption of light. The substrate 1 may be of any well-known structure if it provides an opto-electric conversion.

Referring to FIG. 14, there is shown an example of another form of the diffuse-reflection structure, wherein a diffuse-reflection film 34 made of fine particles is formed on the back of the substrate 1. This film layer makes it possible to provide the same effect as in the structure shown in FIG. 13. Materials for such diffuse-reflection film which may be used include those having a light reflectance and permitting a satisfactory scattering of light, such as fine powders of aluminum oxide, barium sulfate. In this case, it is desirable that the back of the diffuse-reflection layer is covered with a protective film formed of a plastic, metal or another material in order to prevent the release of the diffuse-reflection layer and provide a satisfactory diffuse-reflection. The diffuse-reflection film may be formed by vacuum evaporation of a metal film under a relatively low vacuum or under a sample-heated condition.

Figure 15:
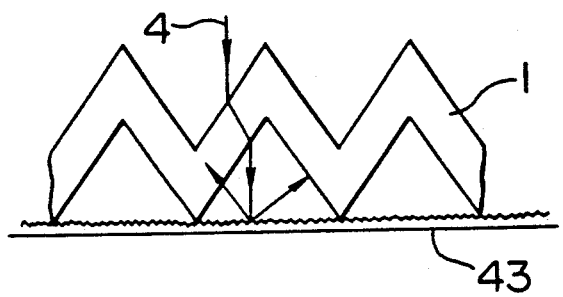
FIG. 15 is a sectional view of a further application of the present invention.
Figure 16:
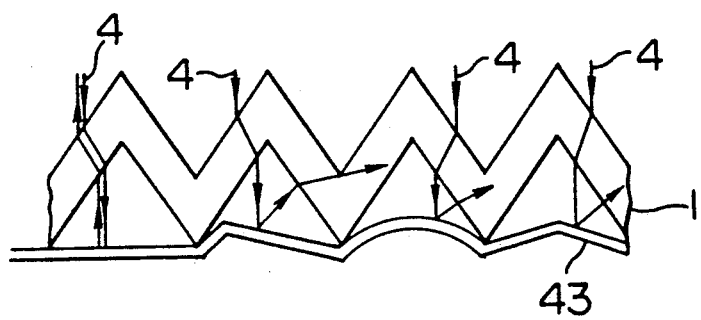
FIG. 16 is a sectional view of a yet further application of the present invention.

A further form of the diffuse-reflection arrangement in accordance with the present invention is shown in FIG. 15. This form is an example in which the substrate 1 is placed on a diffuse-reflection plate 43. The diffuse-reflection plate 43 used is one having a fine textured roughness formed on a surface of a material having a high light reflectance, such as a metal, by machining or etching. Such diffuse-reflection plate may also be formed by a diffuse-reflection film formed from a fine powder of aluminum oxide, barium sulfate, or by a diffuse-reflection film formed by vacuum evaporation of a metal film under a relatively low vacuum or under a sample-heated condition, as described above. Alternatively, said reflection film or said diffuse-reflection film 43 may be formed on the back of the substrate 1 to provide a flat, inclined or curved surface configuration, as shown in FIG. 16.

Figure 17:
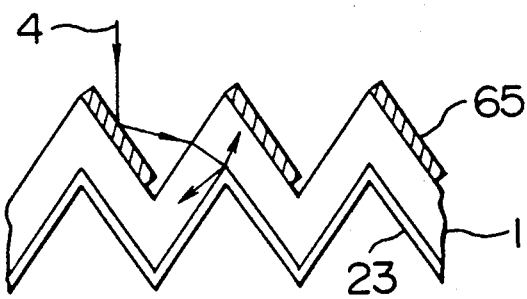
FIG. 17 is a sectional view of a still yet further application of the present invention.
Figure 18:
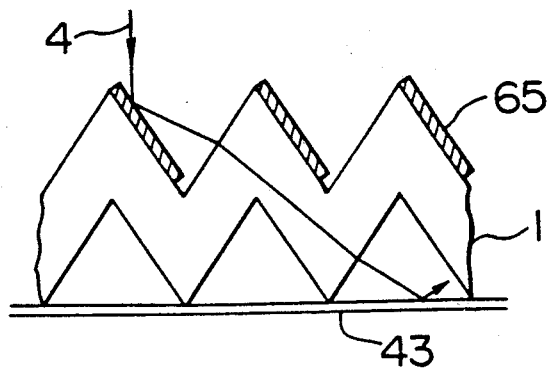
FIG. 18 is a sectional view of an alternative application of the present invention.

The above-described light diffuse-reflecting arrangements can considerably increase opto-electric conversion efficiency of the opto-electric transducing element having an electrode covering a grooved structure so as to increase the electrode area, e.g., the whole or a part of one of opposed bevels of a V-groove with a face electrode 65 having a high reflectance as shown in FIGS. 17 and 18. It is a matter of course that the diffuse-reflecting arrangement may be any of the arrangements described with reference to FIGS. 13 to 16.

Figure 19:
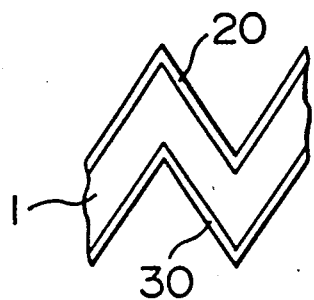
FIG. 19 is a sectional view of one embodiment according to the present invention.
Figure 20:
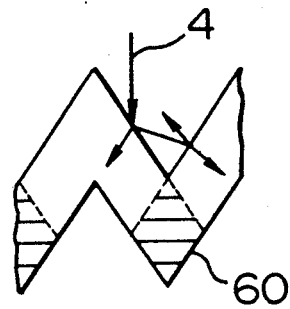
FIG. 20 is a diagram for illustrating a light-excited carrier distribution in accordance with the present invention.
Figure 21:
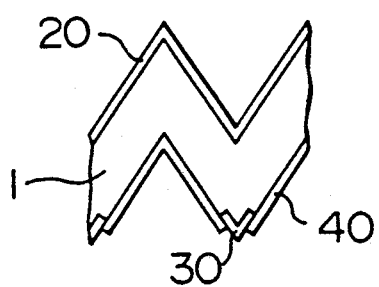
FIG. 21 is a sectional view of an application with a light-excited carrier distribution taken into consideration, in accordance with the present invention.

In an opto-electric transducing element of a structure where a substrate 1 having a corrugated section is formed of a first semiconductor, with its face covered with a second semiconductor 20, for example, consisting of an n+ layer and with its back covered with a third semiconductor 30, for example, consisting of a p+ layer, as shown in FIG. 19, and when incoming light 4 is projected into the element from its face as shown in FIG. 20, the number of light-excited carriers in a primary portion of an oblique line portion 60 is as extremely small, e.g 1/10 to 1/100, as compared with that in the other portions, even if a material having a small light absorbing factor such as Si is employed for the substrate. Therefore, it is desirable that the p+ layer or n+ layer, for example, for ohmic contact with an electrode is provided on the back, formed at the back ridge of the substrate 1, as shown in FIG. 21. On the contrary, because the number of light-generated carriers is very large in the vicinity of the substrate face, it is desirable that, for example, the p+ layer or n+ layer for efficiently collecting the carriers is formed on the face of the substrate 1. Further, it is desirable that the substrate face and the major portion of the back are covered with a so-called passivation film which reduces the rate of surface recombination of minority carriers, e.g., an oxide film.

Figure 22:
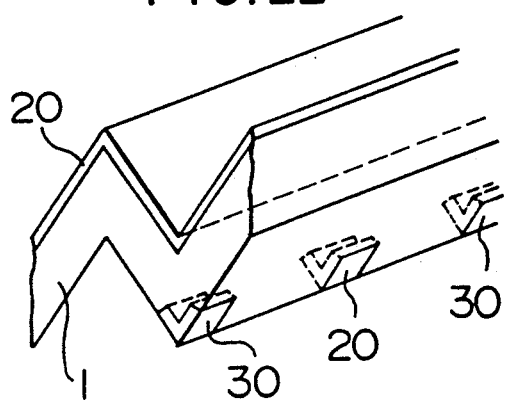
FIG. 22 is a perspective view of another application with light-excited carrier distribution taken into consideration, in accordance with the present invention.

Referring to FIG. 22, there is shown an example where semiconductor layers are formed apart from each other at the back ridge of the substrate. The formation of, for example, p+ layers 30 apart from each other on the back of the substrate 1 in the above manner makes it possible to reduce the area of the p+ layer 30. In addition, electrodes contacting both the + and − poles can be formed on the back by forming a different type semiconductor such as an n+ layer 20 or the like between the p+ layers 30. Even with this structure, it is desirable that the major portion of the face of the substrate 1 is covered with any one or a combination of an n+ layer, a p+ layer and a passivation film in order to reduce the surface recombination at such major portion. It is also desirable that those portions on the back of the substrate 1 which are not covered with such n+ layer 20 or p+ layer 30 are covered with any one or a combination of an n+ layer, a p+ layer and a passivation film. Further, it is desirable that the primary part of that portion on the back of the substrate 1 which is covered with the n+ or p+ layer is covered with a passivation film for a similar reason.

Figure 23:
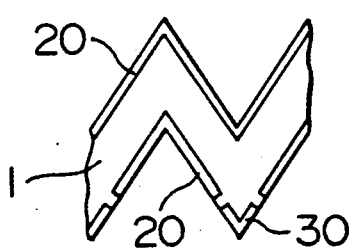
FIG. 23 is a sectional view of a further application with a light-excited carrier distribution taken into consideration, in accordance with the present invention.

An example is shown in FIG. 23, in which for example, an n+ layer 20 for contact with an electrode on the back, as in the above example, is formed on the major portion other than occupied by a p+ layer 30. With this structure, the electric resistance of a current flowing across the element can be suppressed to a small level by placing an electrode on the backside of the semiconductor layer 20, because the latter widely covers the back. Even in this structure, it is desirable that the major portion of the face of the substrate 1 is covered with any one or a combination of an n+ layer, a p+ layer and a passivation film. It is also desirable that the major portion of that section on the back of the substrate 1 not covered with the n+ or p+ layer which is in contact with the electrode, is covered with any one or a combination of an n+ layer, a p+ layer and a passivation film. Further, it is desirable that the major portion of the section on the back of the substrate 1 covered with the n+ or p+ layer is covered with a passivation film.

Figure 24:
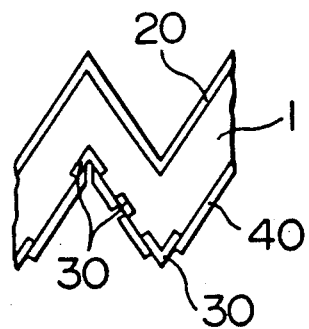
FIG. 24 is a sectional view of a yet further application with a light-excited carrier distribution taken into consideration, in accordance with the present invention.

In FIG. 24, there is shown an example in which p+ semiconductor layers 30 are formed on portions of the bevels and recesses on the back of a corrugated-section structure. The purpose thereof is to prevent a reduction of the opto-electric conversion efficiency due to an increased distance between spaced semiconductors 30 if they are formed only at ridges on the back of the substrate 1, when the electric resistance of the substrate 1 is larger and when the lifetime of the minority carrier is shorter.

In the structures described with reference to FIGS. 22 to 24, the are operable even if the different type semiconductor layers formed on the back are in contact with each other, but it is desirable that the said layers are placed apart from each other, because recombination of the carriers is enhanced at the contact portions when the impurity concentration in the semiconductors is relatively high.

Each of the semiconductor substrates and the semiconductor layers described heretofore may be made of a material having the same band gap, but they may be made of materials having different band gaps, respectively, with a so-called hetero junction formed at therebetween.

Figure 25:
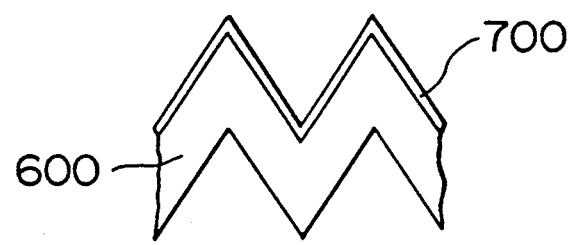
FIG. 25 is a sectional view of an alternative application in accordance with the present invention.

In FIG. 25, there is shown an example of a thin opto-electric transducing element having a first thin opto-electric transducing portion 600 having the corrugated section described heretofore under a second opto-electric transducing portion 700 which generates under irradiation of light change carriers in one or more semiconductor(s) having a band gap different from that of the first thin opto-electric transducing portion. The first thin opto-electric transducing portion is comprised of a semiconductor having the corrugated structure described heretofore, and a passivation film, an electrode and/or a reflection preventing film, and may be of any structure provided it has an opto-electric transducing effect. The second opto-electric transducing portion 700 may also be of any structure if it has a construction similar to that of the first opto-electric transducing portion, but it is desirable that the main light carrier-generating portion has a band gap larger than that of the first opto-electric transducing portion. This is because when the wavelengths of the incident light cover a wide range, the light of individual wavelengths can be absorbed by materials having different band gaps to improve the opto-electric conversion efficiency. The first and second opto-electric transducing portions may be electrically connected to each other through an ohmic contact or a tunnel junction and may independently have different electrodes. While the opto-electric transducing element has been described as having the first and second opto-electric transducing portions, it is a matter of course that the same is true even with an opto-electric transducing element further having a plurality of additional opto-electric transducing portions. The present structure is very useful when the major portion of different opto-electric transducing portions are formed by an epitaxial growth.

While the first opto-electric transducing portion 600 has been described as having an opto-electric transducing effect, the portion may be formed as a lightweight substrate simply having a corrugated section without having the opto-electric transducing effect.

Figure 26:
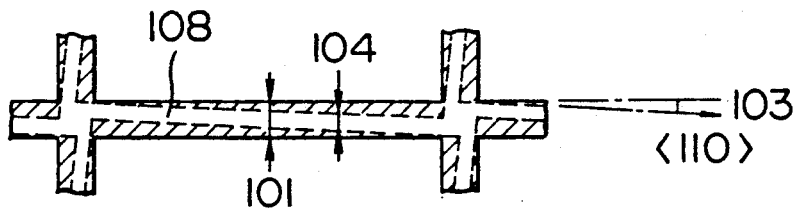
FIG. 26 is a plan view of an example of a thin linear portion of an etching mask with the direction thereof misaligned from the orientation of a single crystal substrate.

Now, when an etching mask as shown in FIG. 26 is formed at a ridge on the face or back of the corrugated section using a single crystal substrate as the substrate, and a corrugated structure is formed by anisotropic etching, and if the angle 103 formed by an intersection of a slowly etched face of the crystal with the crystal face, together with a pattern of the etching mask is larger, an oblique line portion in appears. Consequently, the width 104 of a thin linear portion remaining 108 without being etched may be smaller than the thin line width 101. When such width becomes zero, etched portions on opposite sides of the thin linear portion may mate with each other, so that a very deep etched groove may be provided. In addition, if a defect of the etching mask and/or a defect of the crystal are present on the thin linear portion, the line width 104 becomes a value obtained by subtraction of the size of the defect from a value given when there is no defect. When this width becomes zero, a deep etched groove may also be provided. When a Si, Ge or GaAs substrate having a (100) face is used as the crystal substrate, the slowly etched face is a (111) face, and an intersection of this face with the surface is in a <110> direction. In order to overcome this, the angle 103 formed by the direction of the thin linear portion and the orientation of the crystal is required to be less than an arctan {(a thin 101—a line width 104 after etching)/a thin line length 102}. The line width 104 after etching in this expression means that the crystal face at the ridge on the face of the corrugated structure has only the line width 104 remained without being etched. When there is an etching defect or a crystal defect, sizes of these defects must be added to the line width 104 after etching in the above expression. Additionally, when the amount of the (111) face etched before the completion of etching is not negligible, an amount of line width diminished by such etching should be added to the line width 104 after etching in the above expression. When a solution of KOH or a solution of hydrazine is used for etching of a substrate of Si, the amount of line width diminished by etching of the (111) face before the completion of etching is on the order of about 1/20 to 1/100 of the depth of the etched groove.

Figure 27:
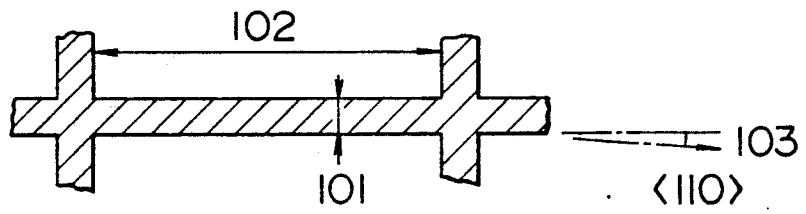
FIG. 27 is a plan view of an example of a thin linear portion of an etching mask with the direction thereof aligned with the orientation of a single crystal substrate.
Figure 28:
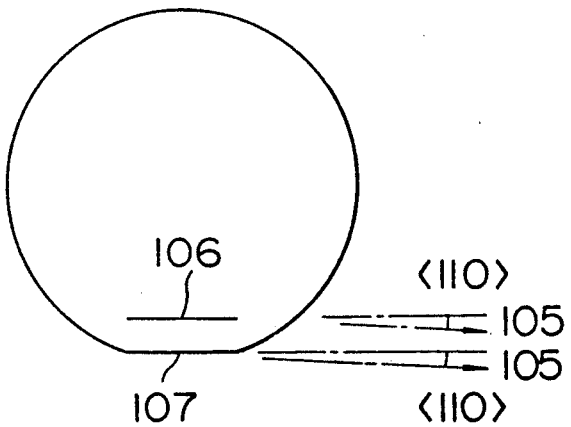
FIG. 28 is a plan view illustrating a relationship between the orientation of a single crystal substrate and a mark.

One means for attaining the above condition will be described below with reference to FIG. 28. When a circular wafer is used as the substrate, a method for indicating the crystal orientation of the wafer using an orientation flat 107 provided by polishing of a face parallel to a particular face may be used. The direction of the orientation flat indicates a direction slightly offset from the true orientation of the crystal in a range of a usual production error. This error will cause a misalignment 103 between the direction of the thin linear portion and the orientation of the crystal as shown, in FIG. 27 wherein an etching mask is formed, with the orientation determined on the basis of the orientation flat. Therefore, the misalignment 105 of the orientation flat from the crystal orientation in FIG. 28 should be less than an arctan {(a thin line width 101—a line width 104 after etching)/a thin line length 102}. For example, when a Si or GaAs substrate having a (100) face is used as a crystal substrate, <110> direction is used as a direction of the orientation flat. For example, if the thin line width 101 is of 20 μm, the line width 104 after etching is of 10 μm, and the thin line length 102 is of 1,000 μm, the arctan {(20 μm−10 μm)/1,000 μm}=0.57 degree and hence, the orientation flat required to be formed so that the misalignment 105 of the orientation flat from the crystal orientation may be less than the above value.

Even when an orientation mark 106 formed on the substrate by laser processing is used as a method for indicating the crystal orientation of the wafer, the same could be said with the misalignment 105 between the mark and the true crystal orientation.

Figure 29:
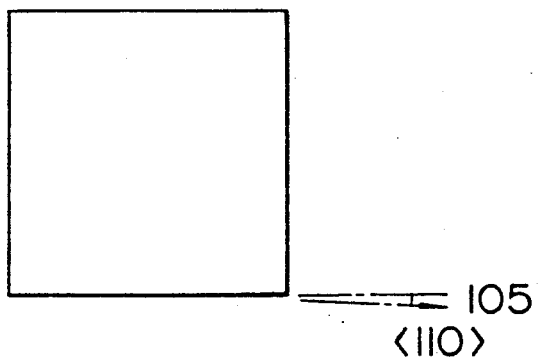
FIG. 29 is a plan view illustrating a relationship between the orientation of a single crystal substrate and the configuration of the substrate.

When a square wafer as shown in FIG. 29 is used as the substrate with its side edge used for alignment in place of the orientation flat, the same could be said with the misalignment between the direction of such edge and the true crystal orientation.

Referring to FIG. 30, description will be made of the formation of the etching mask using photolithography. When a pattern for forming the etching mask is disposed on a photo-mask 110, and in order that the angle formed by the direction of a thin linear portion as shown in FIG. 27 together with the true crystal orientation satisfies the above condition, by using a single or a plurality of alignment mark or marks 130 provided on the photo-mask 110, it is required that the alignment mark(s) 130 and the orientation mark on the substrate 1 or the end side are parallel or aligned with a particular direction at the time of photo-alignment, so that the true crystal orientation and the direction of the thin linear portion on the photo-mask 110 satisfy the above condition. In this case, the accuracy of alignment between the alignment mark 130 and the direction of the thin linear portion, and between the alignment mark 130 and the orientation flat on the substrate 1 or the orientation mark or the end side must be maintained within the above-described angle. Several examples of the shape of the alignment mark are shown in an enlarged view of a portion a in FIG. 30(a). The above method can likewise be employed even when use is made of a technique for forming a resist, for example, by printing, in addition to photolithography.

The shape of an accuracy-requiring pattern formed on the substrate will be described below with reference to FIGS. 31(a) and (b). In forming an etching mask or another pattern by photolithography or by printing as described above, and in order to etch and simultaneously form a high accuracy pattern as a pattern for an alignment mark used for alignment of a photo-mask or a printing mask with the substrate by use of the etching mask, a ridge 160 may be etched because it is located in a portion 150 to be etched in a pattern as shown in FIG. 31(a), and consequently, a side-etched portion 140 such as an oblique line portion may be formed. In order to prevent this, it is necessary, for example, to form the whole or a particular part of a portion to be etched as only a square pattern, as shown in FIG. 31(b).

In order that a numeral, a character or other particular figure or shape can be recognized even after etching, they should be, for example, of a configuration formed by rectangular patterns as shown in FIG. 32(b) rather than a configuration shown in FIG. 32(a) for the same reason. It is a matter of course that the end sides of these rectangles must point in the direction of an intersection between a slowly etched face and the face of the substrate.

The foregoing is true not only with the alignment mark, the numeral and the character, but also with the shape of the major portion of the etching mask, and when a ridge at a portion to be etched as shown in FIG. 33(a) is side-etched as in the oblique line portion 140, it is required that, for example, an arrangement 120 such as an electrode formed at an unetched portion is disposed apart from the side-etched portion 140, or an additional pattern 133 is provided as shown in FIG. 33(b), thereby preventing the side-etching.

While the Si or GaAs crystal substrate having the (100) face has been described above, the same is, of course, true with a substrate having a (110) face or another face. The type of the crystal is not limited to Si and GaAs, but crystals of Ge, InP, CdS, CuInSe, and the like can be likewise used.

The present invention will now be described by way of Examples.

EXAMPLE 1

One example of an opto-electric transducing element is shown in FIG. 34. Using a p-type substrate of Si having a (100) face index, a specific resistance of 0.2 Ω·cm and a thickness of 250 μm, oxide films resulting from thermal oxidation and having a thickness of about 1 μm were formed respectively on opposite surfaces of the substrate; photo-resists were formed respectively at the tops of grooves and at the non-grooved portions, with their relative positions controlled using a well-known double-sided alignment technique, and the oxide films located at portions other than the photo-resists were etched off. The main regions of the etched-off portions were formed by means of rectangular patterns, and an end of each of these rectangles was aligned to the <110> direction. Then, using a solution of KOH, an anisotropic etching was conducted to form a grooved structure which has a (111) face at a portion not covered with the oxide film and in which the angle 6 formed by opposed surfaces thereof was of about 70°. The groove pitch was set at about 240 μm by setting the effective thickness of the element at about 50 μm. A non-grooved portion having a width of about 400 μm was left at the periphery of the element and further, a non-grooved portion was left on a line perpendicular to the grooved structure, thereby enhancing the mechanical strength of the element. Then, an n+ layer 20 was formed on the face by a thermal diffusion of phosphorus, and the n+ layer on the back was removed, followed by a p+ layer 30 formed at the recesses of the grooves by alloying aluminum. Further, Ti/Ag electrodes 65 and 111 were formed on the face and back, respectively. According to the present Example, the output voltage is increased by about 100 mV, as compared with the prior art element of a non-grooved structure.

An example using Si for the substrate 1 has been described above, but other semiconductors such as Ge and the like and compound semiconductors such as GaAs, InP and the like may be used. Even with an n-type substrate, a similar effect can be obtained. In addition etching with the solution of KOH was conducted to form the grooved structure in the above Example, but solutions of NaOH, hydrazine and ammonia series may be used. Alternatively, the grooved structure may be formed by etching with a plasma gas or the like, or by mechanical processing. In such etchings, the side face of the groove may be curved or textured rather than flat in some cases, as is the case with the use of an anisotropic etching, but even in this case, a similar effect can be obtained. An oxide film resulting from thermal oxidation was used as an etching mask in the present Example, but is is possible to use any other film such as silicon oxide and silicon nitride films formed by LPCVD (Low Pressure Chemical Vapor Deposition) or by a spin coating, and an etch resisting film such as wax.

In addition, the structures shown in FIGS. 8 and 10 can be easily formed by an anisotropic etching by use of a substrate with a (110) face.

EXAMPLE 2

An example of an opto-electric transducing module is shown in FIG. 11. Using a plastic sheet for a support 12, a plurality of opto-electric transducing elements 14 were adhered to the support 12. Glass was used for a surface covering material 13. In this module, the above-described opto-electric transducing element was used and hence, the output voltage was increased by 15% as compared with the prior art.

In addition, the weight of the opto-electric transducing elements 14 was reduced to about one half, as compared with the prior art and therefore, the weight of the module was also substantially reduced.

Glass has been used for the surface covering material in the above description, but plastic and the like may be used. Also, a molding material may be filled between the surface covering material 13 and the opto-electric transducing elements 14. Alternatively, the surface covering material 13 may be omitted. The support 12 may be formed from a suitable lightweight material having a good thermal conductivity, such as a plastic as well as a lightweight metal and a ceramic. In addition, the output voltage can further be increased by attaching a light concentrator to the opto-electric transducing module.

EXAMPLE 3

Further embodiments of the present invention will be described below with reference to FIGS. 35 and 36.

Figure 35:
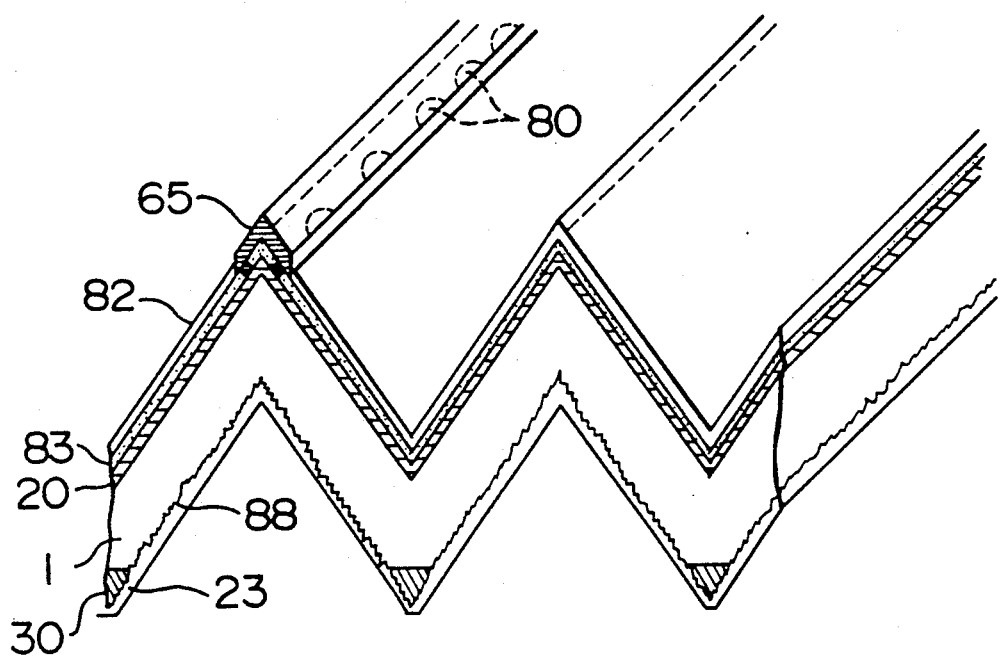
FIG. 35 is a perspective view of another embodiment according to the present invention.

In FIG. 35, there is shown an example of an opto-electric transducing element having a structure which includes a textured roughness formed on the back thereof and a diffuse-reflection film formed thereon. A single crystal of Si was used for a substrate 1 as in Example 1. Using an oxide film resulting from thermal oxidation as a mask, both surfaces of the substrate were subjected to an anisotropic etching with a solution of KOH to provide a corrugated structure, and a fine texture roughness 88 was formed on the back by a dry etching. A suitable gas for the dry etching is mixed gas of carbon tetrachloride and oxygen. Further, Ag was deposited in vacuum on the textured back surface to form a back reflector 23 which also serves as a back electrode. At a stage prior to the formation of the back reflector 23, a p+ layer 30 was formed at a ridge on the back by a diffusion of Al. An n+ layer 20 was formed on the face of the opto-electric transducing element by a diffusion of phosphorus, and the surface thereof was covered with a passivation oxide film 83. An anti-reflection film 82 was further formed thereon. A front face electrode 65 was formed at a part of the front face ridge to come into ohmic contact with the n+ layer 20 through a contact hole 80 opened in the oxide film 83. This ensures that light projected from the face is irregularly or diffusedly reflected on the back. Therefore, most of the light which reaches the front face again is reflected back into the element and trapped in the substrate 1. If the back reflector 23, which also serves as the back electrode, is very low in electric conductivity, then it is desirable that a film having a high electric conductivity is formed thereon.

In addition to the dry etching, the back textured surface may be formed by an isotropic etching with a mixture of hydrofluoric acid and nitric acid or by an anisotropic etching with a solution of KOH, hydrazine or the like.

Figure 36:
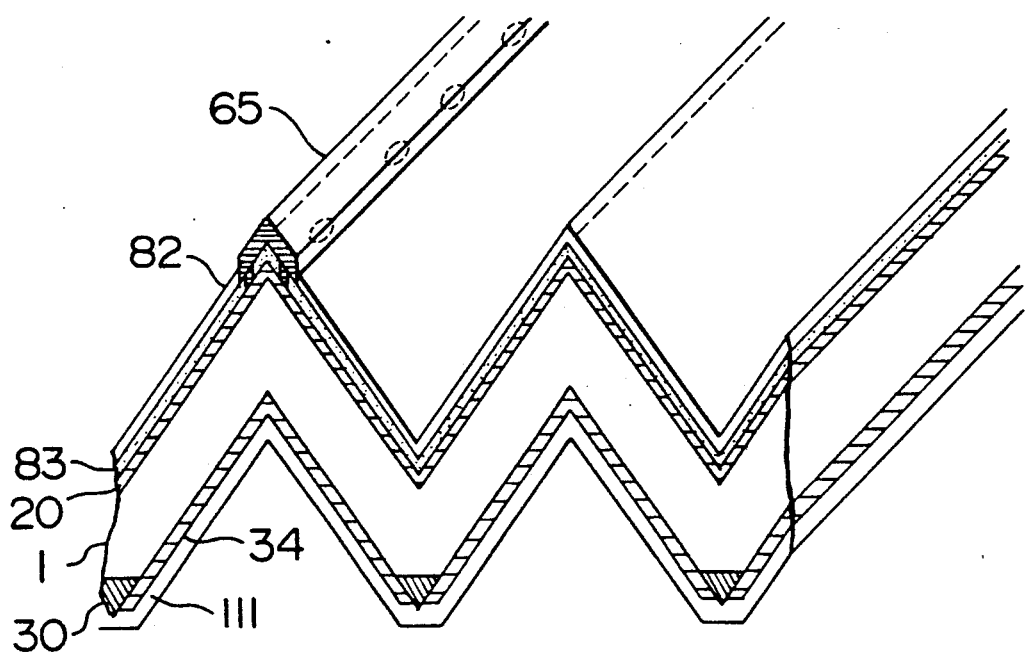
FIG. 36 is a perspective view of a further embodiment according to the present invention.

One example of an opto-electric transducing element having a back diffuse-reflection structure is shown in FIG. 36, which has a diffuse reflection film 34 formed on the back of a substrate 1 by applying a fine powder of a material having a high light reflectance. A fine powder of aluminum oxide was used for said diffuse-reflector 34. Ag was vacuum-evaporated thereon to serve as a back electrode 111. The arrangement of other structures and the effects of the back reflection structures are similar to those in the embodiment shown in FIG. 35. If a material having a relatively high electric conductivity is used for the back reflector layer 34, the back electrode 111 need not necessarily be provided.

EXAMPLE 4

Figure 37:
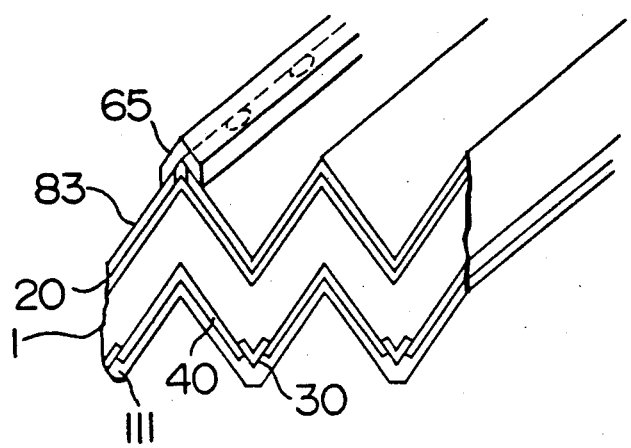
FIG. 37 is a perspective view of a yet further embodiment according to the present invention.

A yet further embodiment of the present invention is shown in FIG. 37. Using a p-type Si semiconductor as a substrate 1, an n+ layer 20 and an oxide film 83 as a passivation film were formed on the front face thereof, and a p+ layer 30 and an oxide film 40 were formed on the back thereof. A front face electrode 65 and a back electrode 111 were provided. With such arrangement, the opto-electric conversion efficiency was improved as compared with a structure having a p+ layer formed on the entire back.

EXAMPLE 5

Figure 38:
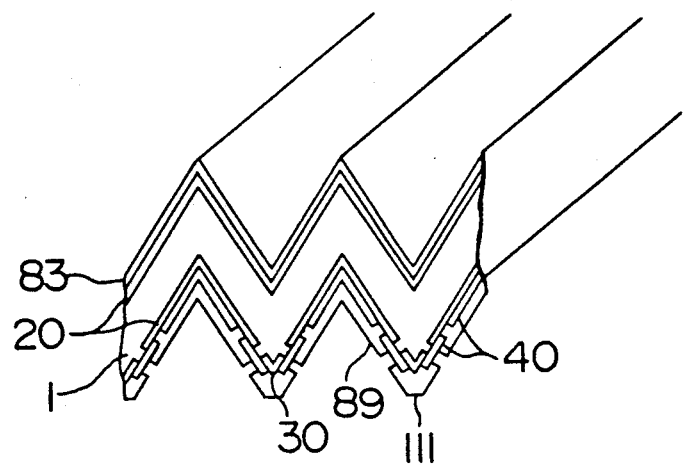
FIG. 38 is a perspective view of a still yet further embodiment according to the present invention.

In FIG. 38, there is shown an example having an n+ layer 20 which is formed on the back surface in contact with a second electrode 89, thereby dispensing with the front face electrode. With such arrangement, no light shielding by the face occurs and hence, all of the incident light can be absorbed, resulting in an improved output current.

EXAMPLE 6

Figure 39:
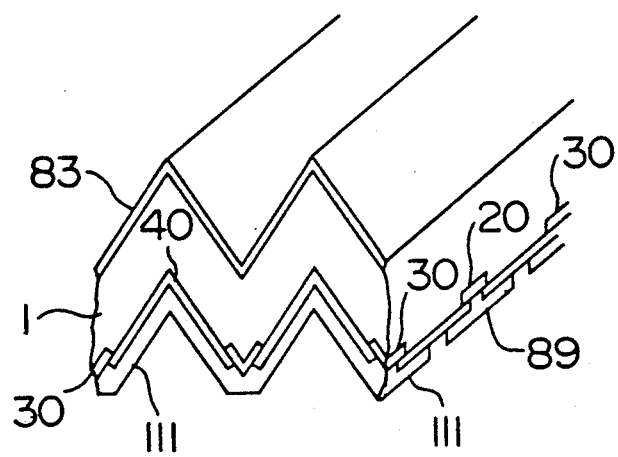
FIG. 39 is a perspective view of an alternative embodiment according to the present invention.

FIG. 39 shows an example of an arrangement having only an oxide film formed on the face and n+ layers 20 and p+ layers 30 alternately disposed on the back. In this example, different type semiconductor layers are disposed at ridges on the same line, but different type semiconductor layers may be disposed at ridges on different lines.

In these Examples, the substrate may be n-type. In addition, the n+ layers on the face and the n+ or p+ layers on the back may be different type. Further, for the oxide film, the passivation film made of a hetero material or the like, the semiconductor layer and the electrode, any materials may be used provided they have the required properties.

In the structures described in the Examples, the semiconductor material forming them may be of single crystalline or polycrystalline Si, GaAs, InP, Ge, CuInSe and CdS, but also may be of amorphous materials such as amorphous Si, SiGe, Sic and the like.

EXAMPLE 7

Figure 40:
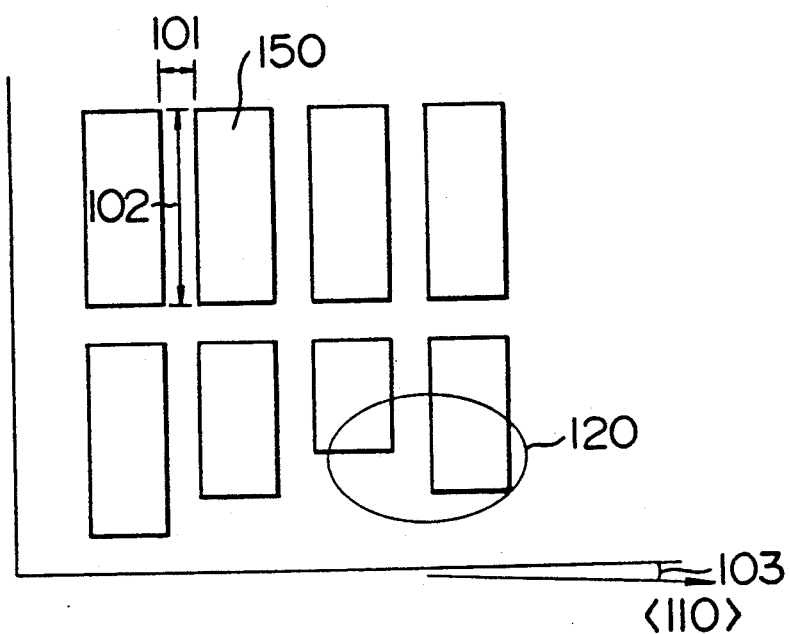
FIG. 40 is a diagram of an example of an etching mask pattern in accordance with the present invention.

As shown in FIG. 40, the thin line width 101 of the etching mask was 20 μm, and the thin line length 102 was 1,000 μm. The misalignment between the end side of the etching mask and the orientation of the crystal was adjusted within ±0.4 degree by use of the above-described method. The configuration of the portion 120 in which the electrode is formed is provided only in rectangles as shown in Figures, with ridges eliminated. Upon forming the thin substrate using such an etching mask, a substrate free from any defect in the etching could be provided.

An n+ layer was formed on the face of this substrate, and a p+ layer was formed on the back thereof, whereupon a lightweight and thin element could be produced with a high accuracy and a good reproducibility.

What is claimed is:

1. A process for producing an opto-electric transducing element, comprising the steps of;
    processing a semiconductor substrate having a first electrically conductive type into a corrugated structure;
    forming a semiconductor layer having a second electrically conductive type on the face of said substrate;
    forming a face electrode on a portion of said semiconductor layer having the second electrically conductive type; and
    forming a back electrode on the back of said substrate;
    wherein said semiconductor substrate is of a single crystal;
    wherein processing of said substrate is conducted by use of an anisotropic etching; and
    wherein the angle formed by the direction of a thin linear pattern of an etching mask for said anisotropic etching together with the direction of an intersection between a slowly etched face and the face of said substrate is more than 0° and less than an arctan {(a thin line width—a line width after etching)/a thin line length}.

2. A process for producing an opto-electric trnasducing element as set forth in claim 1, wherein the face of said substrate is a (100) face, and said slowly etched is a (111) face.

3. A process for producing an opto-electric transducing element as set forth in claim 1, wherein the face of said substrate is a (110) face, and said slowly etched face is a (111) face.

4. A process for producing an opto-electric transducing element as set forth in claim 1, wherein the substrate in which the angle formed by a mark indicative of the crystal orientation together with the true crystal orientation of said substrate is more than 0° and less than an arctan {(a thin line width—a line width after etching)/a thin line length)}.

5. A process for producing an opto-electric transducing element as set forth in claim 1, wherein said etching mask is formed by use of a photolithography, and an alignment mark is provided on a portion of a photomask, so that the angle formed by the mark indicative of the crystal orientation together with said alignment mark is more than 0° and less than an arctan {(a thin line width—a line width after etching)/a thin line length}.

6. A process for producing an opto-electric transducing element, comprising the steps of:
    forming a first etching mask having a thin linear pattern on a face of a single crystal semiconductor substrate having a first electrically conductive type wherein an angle formed by the direction of said thin linear pattern together with the direction of an intersection between a slowly etched face and the face of said substrate is greater than 0° and less than an arctan;
    forming a second etching mask on the back side of said substrate by forming a thin linear pattern thereon in such a manner that the thin linear pattern of the second etching mask is parallel to, but not overlapping with the thin linear pattern of the first etching mask;
    processing said substrate into a corrugated form by means of anisotropic etching using the first and the second etching masks;
    forming an opto-electric transducer by forming a first impurity doped region having a first electrically conductive type on the face of the substrate and a second impurity doped region having a second electrically conductive type which is different from that of said first electrically conductive type; and
    forming a set of electrodes on said opto-electric transducers connected separately to each of said first and second impurity doped regions.

7. A process for producing an opto-electric transducing comprising the steps of:
    forming a first etching mask having a thin linear pattern on the face of a single crystal semiconductor substrate having a first electrically conductive type wherein an angle formed by the direction of said thin linear pattern together with the direction of an intersection between a slowly etched face and the face of said substrate is greater than 0° and less than an arctan;
    forming a second etching mask on the back side of said substrate by forming a thin linear pattern thereon in such a manner that the thin linear pattern of the second etching mask is parallel to, but not overlapping with the thin linear pattern of the first etching mask;
    processing said substrate into a corrugated form by means of anisotropic etching using the first and the second etching masks;
    forming an opto-electric transducer with said corrugated substrate;
    forming electrode means on said opto-electric transducer, and
    taking an electric output from said opto-electric transducer.

8. A process for producing an opto-electric transducing element, comprising the steps of:

forming a first etching mask having a thin linear pattern on the face of a single crystal semiconductor substrate having a first electrically conductive type wherein an angle formed by the direction of said thin linear pattern together with the direction of an intersection between a slowly etched face and the face of said substrate is greater than 0° and less than an arctan;

forming a second etching mask on the back side of said substrate by forming a thin linear pattern thereon in such a manner that the thin linear pattern of the second etching mask is parallel to, but not overlapping the thin linear pattern of the first etching mask; and processing said substrate into a corrugated form by means of anisotropic etching using the first and the second etching masks.

9. The process according to claim 8 wherein said etching mask is made from one member selected from the group consisting of a photoresist layer, a silicon oxide layer and silicon nitride layer.

* * * * *

UNITED STATES PATENT AND TRADEMARK OFFICE
CERTIFICATE OF CORRECTION

PATENT NO. : 5,024,953

DATED : 18 June 1991

INVENTOR(S) : Tsuyoshi UEMATSU et al.

It is certified that error appears in the above-identified patent and that said Letters Patent is hereby corrected as shown below:

| Column | Line | |
|---|---|---|
| 5 | 42 | After "provides" delete "a". |
| 6 | 40 | After "is" delete "as". |
| 7 | 41 | After "24" delete "the". |
| 7 | 52 | After "formed" delete "at". |
| 7 | 59 | Replace "change" with --charge--. |
| 8 | 33 | Before "appears" delete --in--. |
| 8 | 55 | Change "remained" to --remaining--. |
| 9 | 11 | Delete ",". |
| 9 | 12 | Delee ",". |

UNITED STATES PATENT AND TRADEMARK OFFICE
CERTIFICATE OF CORRECTION

PATENT NO. : 5,024,953

DATED : 18 June 1991

INVENTOR(S) : Tsuyoshi UEMATSU et al.

It is certified that error appears in the above-identified patent and that said Letters Patent is hereby corrected as shown below:

| Column | Line | |
|---|---|---|
| 9 | 19 | After "substrate," insert --a--. |
| 9 | 24 | After "flat" insert --is--. |
| 10 | 22 | After "portion" insert --150--. |
| 10 | 33 | Change "CuInSe" to --$CuInSe_2$--. |
| 11 | 68 | Change "texture" to --textured--. |
| 13 | 12 | Change "CuInSe" to --$CuInSe_2$--. |
| 13 | 57 | Change "trnasduc-" to -- transduc- --. |
| 13 | 59 | After "etched" insert --face--. |
| 13 | 66 | After "substrate" insert --used is a substrate--. |

UNITED STATES PATENT AND TRADEMARK OFFICE
CERTIFICATE OF CORRECTION

PATENT NO. : 5,024,953

DATED : 18 June 1991

INVENTOR(S) : Tsuyoshi UEMATSU et al.

It is certified that error appears in the above-identified patent and that said Letters Patent is hereby corrected as shown below:

| Column | Line | |
|--------|------|---|
| 14 | 21 | After "arctan" insert --{(a thin line width a line width after etching)/ a thin line length}--. |
| 14 | 51 | After "arctan" insert --{(a thin line width a line width after etching)/ a thin line length}--. |
| 14 | 43 | Before "comprising" insert --element--. |
| 15 | 8 | After "arctan" insert --{(a thin line width a line width after etching)/ a thin line length}--. |

Signed and Sealed this

Twenty-third Day of February, 1993

Attest:

STEPHEN G. KUNIN

*Attesting Officer*     *Acting Commissioner of Patents and Trademarks*